United States Patent
Mishra et al.

(10) Patent No.: US 8,053,327 B2
(45) Date of Patent: Nov. 8, 2011

(54) METHOD OF MANUFACTURE OF AN INTEGRATED CIRCUIT SYSTEM WITH SELF-ALIGNED ISOLATION STRUCTURES

(75) Inventors: Shailendra Mishra, Singapore (SG); Lee Wee Teo, Singapore (SG); Yong Meng Lee, Singapore (SG); Zhao Lun, Singapore (SG); Chung Woh Lai, Singapore (SG); Shyue Seng Tan, Singapore (SG); Jeffrey Chee, Singapore (SG); Johnny Widodo, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 667 days.

(21) Appl. No.: 11/614,961

(22) Filed: Dec. 21, 2006

(65) Prior Publication Data

US 2008/0150074 A1  Jun. 26, 2008

(51) Int. Cl.
*H01L 21/76* (2006.01)
*H01L 21/00* (2006.01)
(52) U.S. Cl. ......... 438/423; 438/407; 438/424; 438/480
(58) Field of Classification Search .................. 438/199, 438/221, 700, 407, 423, 424, 480
See application file for complete search history.

(56) References Cited

U.S. PATENT DOCUMENTS

| | | | |
|---|---|---|---|
| 4,700,454 A | 10/1987 | Baerg et al. | |
| 4,717,677 A | 1/1988 | McLaughlin et al. | |
| 4,810,664 A | 3/1989 | Kamins et al. | |
| 5,955,767 A | 9/1999 | Liu et al. | |
| 6,069,054 A | 5/2000 | Choi | |
| 6,229,187 B1* | 5/2001 | Ju | 257/396 |
| 6,294,817 B1 | 9/2001 | Srinivasan et al. | |
| 6,333,532 B1 | 12/2001 | Davari et al. | |
| 6,352,903 B1 | 3/2002 | Rovedo et al. | |
| 6,403,482 B1 | 6/2002 | Rovedo et al. | |
| 6,429,091 B1 | 8/2002 | Chen et al. | |
| 6,429,099 B1* | 8/2002 | Christensen et al. | 438/480 |
| 6,525,340 B2 | 2/2003 | Colavito et al. | |
| 6,846,727 B2* | 1/2005 | Fogel et al. | 438/479 |
| 6,884,702 B2 | 4/2005 | Wei et al. | |
| 2004/0023473 A1* | 2/2004 | Divakaruni et al. | 438/551 |
| 2005/0104131 A1* | 5/2005 | Chidambarrao et al. | 257/369 |
| 2005/0139952 A1* | 6/2005 | Koh | 257/510 |
| 2005/0142795 A1* | 6/2005 | Ahn et al. | 438/400 |
| 2005/0170570 A1* | 8/2005 | DeSouza et al. | 438/162 |
| 2005/0282392 A1* | 12/2005 | Steigerwalt et al. | 438/700 |

* cited by examiner

*Primary Examiner* — N Drew Richards
*Assistant Examiner* — Michael Jung
(74) *Attorney, Agent, or Firm* — Mikio Ishimaru

(57) ABSTRACT

An integrated circuit system is provided including providing a substrate, forming an isolation structure base in the substrate without removal of the substrate, and forming a first transistor in the substrate next to the isolation structure base.

10 Claims, 5 Drawing Sheets

METHOD OF MANUFACTURE OF AN INTEGRATED CIRCUIT SYSTEM WITH SELF-ALIGNED ISOLATION STRUCTURES

TECHNICAL FIELD

The present invention relates to the field of integrated circuits and more specifically to integrated circuit with strained transistor.

BACKGROUND ART

Modern electronics, such as smart phones, personal digital assistants, location based services devices, digital cameras, music players, servers, and storage arrays, are packing more integrated circuits into an ever shrinking physical space with expectations for decreasing cost. Both higher performance and lower power are also quintessential requirements for electronics to continue proliferation into everyday. For example, more functions are packed into a cellular phone with higher performance and longer battery life. Numerous technologies have been developed to meet these requirements.

Integrated circuits are often manufactured in and on silicon and other integrated circuit wafers. Integrated circuits include literally millions of metal oxide semiconductor field effect transistors (MOSFET). Advances in integrated circuit technology continue to shrink the sizes of these transistors and drive for higher performance with minimum power consumption. This dichotomy has inspired various approaches to solve the need for speed at lower power.

As fabrication techniques for semiconductor integrated circuits have developed, the number of elements in a chip has increased. Element size has decreased as integration density has increased. Fabrication line width has decreased from sub-micron to quarter-micron, and smaller. Regardless of the reduction in element size, however, adequate insulation or isolation must be required among individual elements in a chip so that optimal performance can be achieved. The main object is to form isolations among individual elements, reducing their size as much as possible and ensuring superior isolation while creating more chip space for more elements.

Among the different element isolation techniques, local oxidation of silicon (LOCOS) and trench isolation are the most common. The trench isolation technique has received particular notice as it provides a small isolation region and the substrate surface remains level post process. The conventional deposition method for fabricating trench isolations with high aspect ratio requires multiple deposition and etching cycles, thus it is expensive and offers reduced yield. Additionally, as the density of integrated circuits increases and element size is reduced, the deposition method provides inadequate step coverage resulting in incompletely filled trenches, resulting in detrimental isolation and further reduced yields.

As the aspect ratio of the trenches increase to keep up with the increasing density of integrated circuits, the trench process suffers from gap fill issues. In order to avoid gap fill issues, the trench process has become more complicated, such as multiple deposition and sputter/etch steps, and the manufacturing cost has increased. The aspect ratio may also decrease the distance the carrier has to travel to cause isolation failure resulting in increasing failures. The distance may also be further reduced, if isolation structures are misaligned with respect to the circuits they are to protect. The increasing density and higher aspect ratio result in integrated circuits that are more sensitive to isolation variations such as gap fill and misalignment.

As the demand for smaller electronic devices grows, manufacturers are seeking ways to increase density of the elements in the integrated circuit while providing isolation technology and at the same time, reducing manufacturing complexity, costs and failures. Prior attempts to increase density while providing isolation have brought additional fabrication cycles, additional costs, reduced performance, and reduced yields.

Thus, a need still remains for improving the yield, cost, and size of the basic transistor structures and manufacturing to obtain maximum performance improvement, power reduction, or both. In view of the demand for faster microprocessors and memory devices, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including providing a substrate, forming an isolation structure base in the substrate without removal of the substrate, and forming a first transistor in the substrate next to the isolation structure base.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
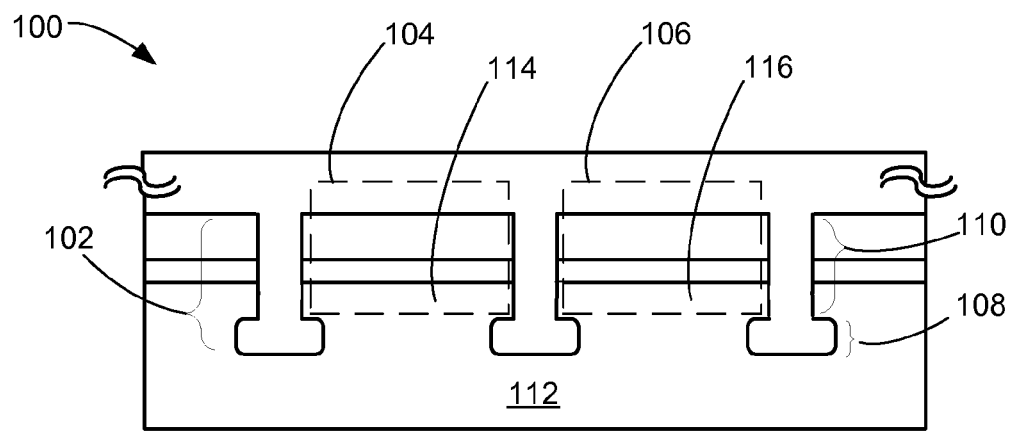
FIG. 1 is a cross-sectional view of an integrated circuit system 100 in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements.

The term "processing" as used herein includes deposition of material, patterning, exposure, development, etching, cleaning, molding, and/or removal of the material or as required in forming a described structure.

Referring now to FIG. 1, therein is shown a cross-sectional view of an integrated circuit system 100 in an embodiment of the present invention. A self-aligned inverted T-shaped isolation structure 102 provides isolation between a first device 104, such as a field effect transistor, and a second device 106, such as a field effect transistor. The first device 104 which may be a N-type field effect transistor transferring electrons (not shown), requires electrical isolation from the second device 106 which may be a P-type field effect transistor transferring holes (not shown). An isolation structure base 108 of the self-aligned inverted T-shaped isolation structure 102 provides additional isolation and gives the cross-section a shape of an inverted "T". The inverted "T" shape of the self-aligned inverted T-shaped isolation structure 102 has an isolation structure column 110 perpendicular and above the isolation structure base 108.

The self-aligned inverted T-shaped isolation structure 102 is in a substrate 112, such as a silicon substrate. The substrate 112 also has the first device 104 and the second device 106. The first device 104 has a first device body 114, such as a P-well. The first device body 114 may not prevent electrons from transferring to a second device body 116, such as an N-well, of the second device 106. Conversely, the second device body 116 may not prevent holes from transferring to the first device body 114. The self-aligned inverted T-shaped isolation structure 102 provides electrical isolation to prevent electrons and holes from transferring between the first device 104 and the second device 106.

For illustrative purposes, the first device 104 is described as a single transistor, although it is understood that the first device 104 may represent a number of transistors. Also for illustrative purposes, the second device 106 is also described as a single transistor, although it is understood that the second device 106 may represent a number of transistors.

Figure 2:
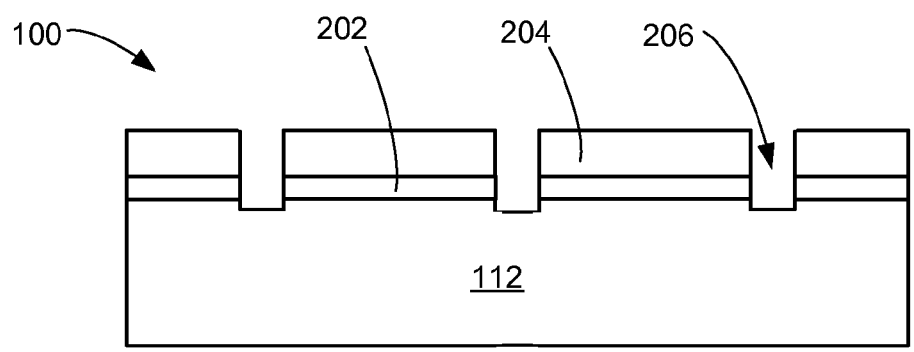
FIG. 2 is a cross-sectional view of the integrated circuit system 100 in a first mask phase.

Referring now to FIG. 2, therein is shown a cross-sectional view of the integrated circuit system 100 in a first mask phase. An insulator, such as a pad oxide layer 202, is applied over the substrate 112. The pad oxide layer 202 may provide an attachment surface for another insulator layer, such as a nitride layer 204. The nitride layer 204 is formed on the pad oxide layer 202. A photoresist (not shown) may be applied on the nitride layer 204. The photoresist may be selectively applied to specific sections in a predetermined pattern. The photoresist provides a barrier to depositing of materials during deposition processes or to protect the volume below the covered area from etching.

An etching process, such as an anisotropic reactive ion etch, removes a portion of the nitride layer 204 and a portion of the pad oxide layer 202 not covered by the photoresist. The nitride layer 204 and the pad oxide layer 202 are partially removed to form a recess 206. The recess 206 occurs in the predetermined pattern provided by the photoresist. The photoresist is removed, such as a stripping process, from the nitride layer 204.

Figure 3:
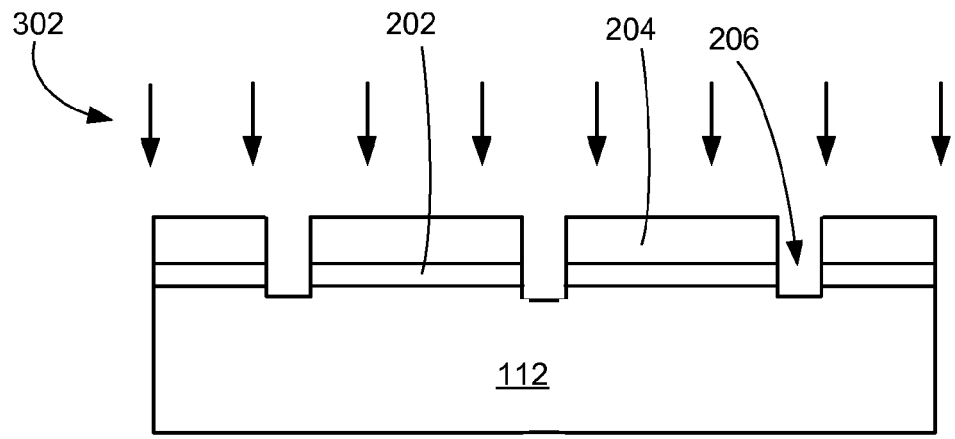
FIG. 3 is a cross-sectional view of the structure of FIG. 2 in an implantation phase.

Referring now to FIG. 3, therein is shown a cross-sectional view of the structure of FIG. 2 in an implantation phase. The structure of FIG. 2 undergoes an oxygen implantation 302, such as a low energy oxygen ion implantation. The nitride layer 204 and the pad oxide layer 202 prevents the oxygen implantation 302 penetrating into the substrate 112 below the volume covered by the nitride layer 204 and the pad oxide layer 202. The oxygen implantation 302 penetrates into the substrate 112 through the recess 206 formed by the opening in the nitride layer 204 and the pad oxide layer 202.

Figure 4:
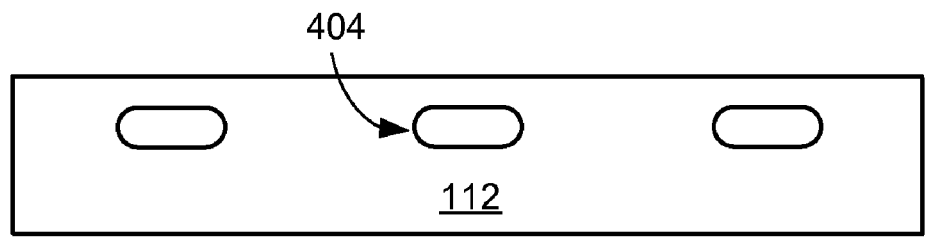
FIG. 4 is a cross-sectional view of the structure of FIG. 3 in a first mask removal phase.

Referring now to FIG. 4, therein is shown a cross-sectional view of the structure of FIG. 3 in a first mask removal phase. The oxygen implantation 302 of FIG. 3 formed oxygenated regions 404 in the substrate 112 not covered by the nitride layer 204 of FIG. 3 and the pad oxide layer 202 of FIG. 3. The nitride layer 204 and the pad oxide layer 202 are removed leaving the oxygenated regions 404 in the substrate 112. The pad oxide layer 202 and the nitride layer 204 may be removed by any number of processes, such as by chemical and mechanical planarization (CMP). The implantation process used to create the oxygenated regions 404 is called separation by implantation of oxygen (SIMOX).

Figure 5:
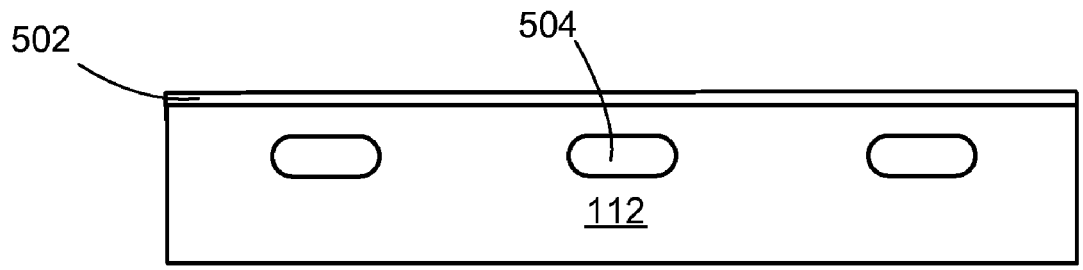
FIG. 5 is a cross-sectional view of the structure of FIG. 4 in an anneal phase.

Referring now to FIG. 5, therein is shown a cross-sectional view of the structure of FIG. 4 in an anneal phase. An annealing process congregates the implanted ions in the oxygenated regions 404 towards the center forming a buried oxide 504 (BOX). The annealing process repairs defects, such as voids or inclusions, in the buried oxide 504. The annealing process also congregates the implanted ions towards the center of the buried oxide 504 reducing the charge trapped at the interface of the buried oxide 504 and the substrate 112 above the buried oxide 504. This improves the control of the threshold voltages of the first device 104 of FIG. 1 and the second device 106 of FIG. 1. The buried oxide 504 forms the isolation structure base 108 of FIG. 1.

The annealing process may be performed at a temperature between 900 C and 1350 C for an approximate duration between 1 second and 30 minutes. The annealing temperature and duration may vary beyond the exemplified values.

After the annealing process, an epitaxial layer 502, such as silicon epitaxy, is grown on the substrate 112 and above the buried oxide 504 (BOX) of FIG. 5. The epitaxial layer 502 is typically of the same or of similar material as the substrate 112. The epitaxial layer 502 may repair defects, of the substrate 112 and above the oxygenated regions 404 that may cause structural and electrical problems.

The epitaxial layer 502 provides a thicker layer for device fabrication than can be achieved with oxygen implant alone. Therefore, the depth and hence energy of the oxygen implantation 302 of FIG. 3 may be reduced as compared an embodiment where an epi layer is not grown. Accordingly, the epitaxial layer 502 allows reduction of lateral scatter and formation of devices, such as the first device 104 and the second device 106, that be spaced closer together increasing device density. Also, the epitaxial layer 502 reduces the effect of the oxygen implantation 302 and anneal as limiting factors to scaling thereby allowing devices to be spaced closer together and the invention to be used even in future technology nodes where line/space requirements are more stringent.

Figure 6:
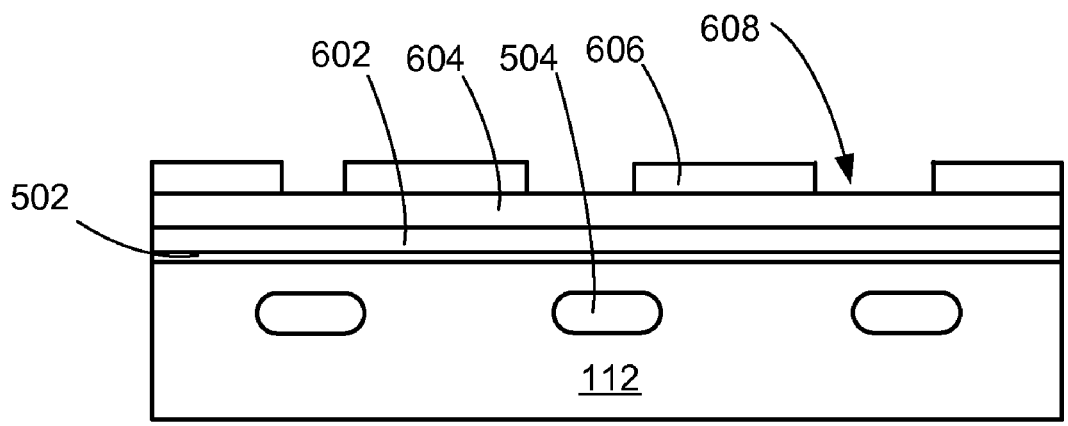
FIG. 6 is a cross-sectional view of the structure of FIG. 5 in a second mask phase.

Referring now to FIG. 6, therein is shown a cross-sectional view of the structure of FIG. 5 in a second mask phase. An insulator, such as a pad oxide layer 602, is applied over the epitaxial layer 502 and above the substrate 112. The pad oxide layer 602 may provide an attachment surface for another insulator layer, such as a nitride layer 604. The nitride layer 604 is formed on the pad oxide layer 602.

A mask 606 may be applied on the nitride layer 604. The mask 606 having a recess 608 in a predetermined pattern may be selectively applied to specific section. The recess 608 is aligned over the buried oxide 504 without the need for etching the mask 606. The recess 608 is not as wide as the buried oxide 504 and represents the width substantially the same as the width of the isolation structure column 110. The mask 606 protects the volume of the substrate 112 that will form the active regions of the first device 104 and the second device 106.

Figure 7:
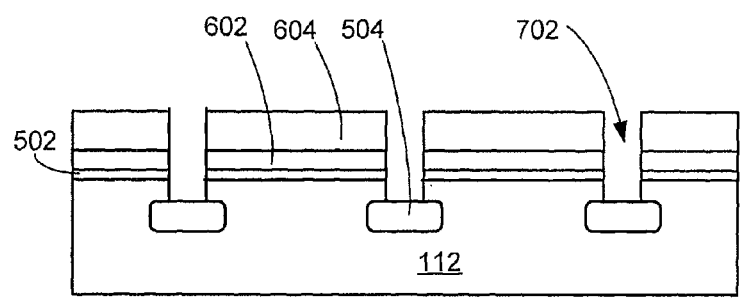
FIG. 7 is a cross-sectional view of the structure of FIG. 6 in an etching phase.

Referring now to FIG. 7, therein is shown a cross-sectional view of the structure of FIG. 6 in an etching phase. An etching process, such as an anisotropic reactive ion etch, removes a portion of the nitride layer 604, a portion of the pad oxide layer 602, a portion of the epitaxial layer 502, and a portion of the substrate 112 not covered by the mask 606 of FIG. 6. The nitride layer 604, the pad oxide layer 602, the epitaxial layer 502, and the substrate 112 are partially removed forming a trench 702 to the buried oxide 504. The trench 702 is perpendicular to the buried oxide 504. The mask 606 is removed, such as a stripping process, from the nitride layer 604.

Figure 8:
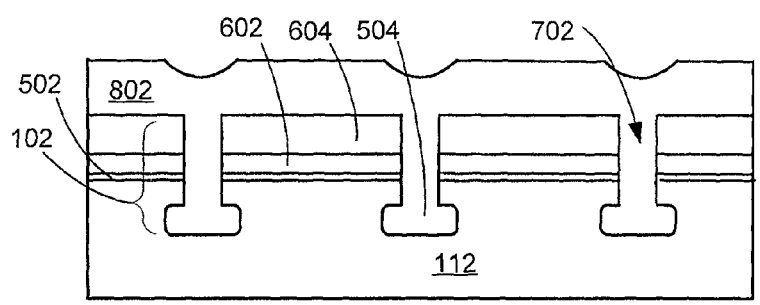
FIG. 8 is a cross-sectional view of the structure of FIG. 8 in a fill phase.

Referring now to FIG. 8, therein is shown a cross-sectional view of the structure of FIG. 8 in a fill phase. The structure of FIG. 8 undergoes a vertical filling process, such as high density plasma (HDP) fill, with a material, such as an oxide, substantially the same as the buried oxide 504. A gap fill layer 802 fills the trench 702 in the substrate 112 forming the self-aligned inverted T-shaped isolation structure 102. The gap fill layer 802 also covers the nitride layer 604 over the pad oxide layer 602 and the epitaxial layer 502. The structure of FIG. 8 with the gap fill layer 802 may be further processed forming the integrated circuit system 100 of FIG. 1.

Figure 9:
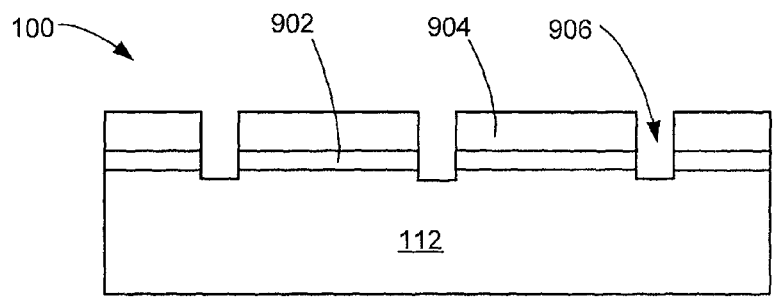
FIG. 9 is a cross-sectional view of the integrated circuit system 100 in an alternate first mask phase.

Referring now to FIG. 9, therein is shown a cross-sectional view of the integrated circuit system 100 in an alternate first mask phase. An insulator, such as a pad oxide layer 902, is applied over the substrate 112. The pad oxide layer 902 may provide an attachment surface for another insulator layer, such as a nitride layer 904. The nitride layer 904 is formed on the pad oxide layer 902. A photoresist (not shown) may be applied on the nitride layer 904. The photoresist may be selectively applied to specific sections in a predetermined pattern. The photoresist provides a barrier to depositing of materials during deposition processes or to protect the volume below the covered area from etching.

An etching process, such as an anisotropic reactive ion etch, removes a portion of the nitride layer 904 and a portion of the pad oxide layer 902 not covered by the photoresist. The nitride layer 904 and the pad oxide layer 902 are partially removed to form a recess 906. The recess 906 occurs in the predetermined pattern provided by the photoresist. The photoresist is removed, such as a stripping process, from the nitride layer 904.

Figure 10:
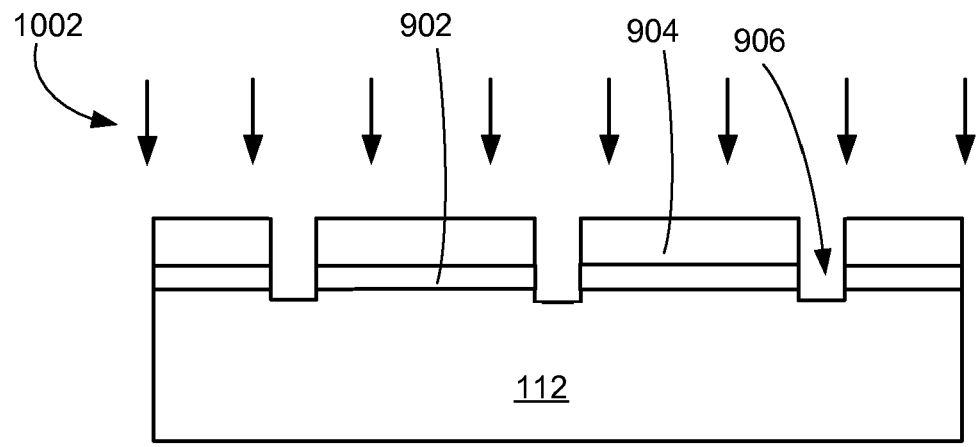
FIG. 10 is a cross-sectional view of the structure of FIG. 9 in an alternate implantation phase.

Referring now to FIG. 10, therein is shown a cross-sectional view of the structure of FIG. 9 in an alternate implantation phase. The structure of FIG. 9 undergoes an oxygen implantation 1002, such as a low energy oxygen ion implantation. The nitride layer 904 and the pad oxide layer 902 prevents the oxygen implantation 1002 penetrating into the substrate 112 below the volume covered by the nitride layer 904 and the pad oxide layer 902. The oxygen implantation 1002 penetrates into the substrate 112 through the recess 906 formed by the opening in the nitride layer 904 and the pad oxide layer 902.

Figure 11:
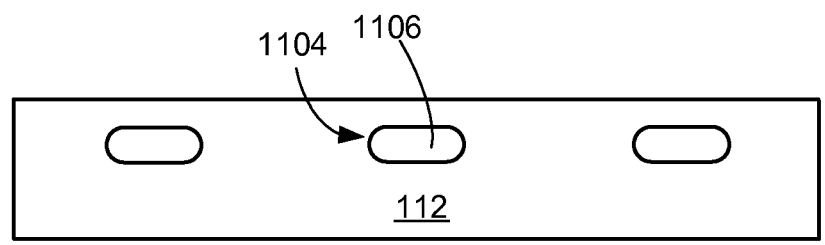
FIG. 11 is a cross-sectional view of the structure of FIG. 10 in an alternate first mask removal phase.

Referring now to FIG. 11, therein is shown a cross-sectional view of the structure of FIG. 10 in an alternate first mask removal phase. The oxygen implantation 1002 of FIG. 10 formed oxygenated regions 1104 in the substrate 112 not covered by the nitride layer 904 of FIG. 10 and the pad oxide layer 902 of FIG. 10. The nitride layer 904 and the pad oxide layer 902 are removed leaving the oxygenated regions 1104 in the substrate 112. The pad oxide layer 902 and the nitride layer 904 may be removed by any number of processes, such as by chemical and mechanical planarization (CMP). The implantation process used to create the oxygenated regions 1104 is called separation by implantation of oxygen (SIMOX).

An annealing process congregates the implanted ions in the oxygenated regions 1104 towards the center forming a buried oxide 1106 (BOX). The annealing process repairs defects, such as voids or inclusions, in the buried oxide 1106. The annealing process also congregates the implanted ions towards the center of the buried oxide 1106 reducing the charge trapped at the interface of the buried oxide 1106 and the substrate 112 above the buried oxide 1106. This improves the control of the threshold voltages of the first device 104 of FIG. 1 and the second device 106 of FIG. 1. The buried oxide 1106 forms the isolation structure base 108 of FIG. 1.

The annealing process may be performed at a temperature between 900 C and 1350 C for an approximate duration between 1 second and 30 minutes. The annealing temperature and duration may vary beyond the exemplified values. To allow devices to be fabricated on the wafer after the formation of the buried oxide 1106, the oxygen ion implantation 1002 and annealing process is chosen such that a layer of crystalline material (e.g. crystalline Si) is present in the substrate 112 above the buried oxide 1106.

Figure 12:
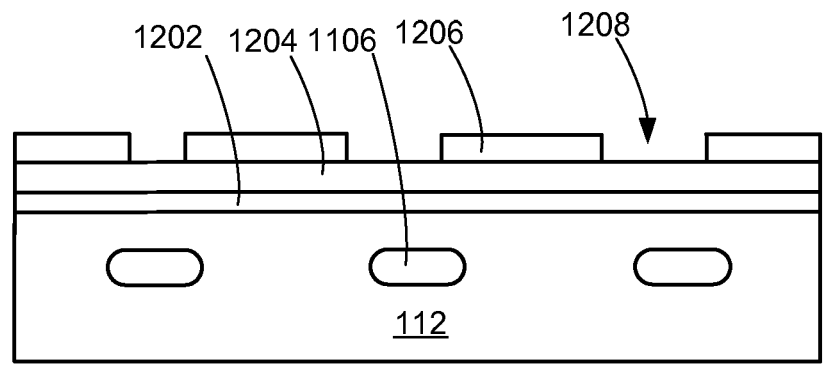
FIG. 12 is a cross-sectional view of the structure of FIG. 11 in an alternate second mask phase.

Referring now to FIG. 12, therein is shown a cross-sectional view of the structure of FIG. 11 in an alternate second mask phase. An insulator, such as a pad oxide layer 1202, is applied over the substrate 112. The pad oxide layer 1202 may provide an attachment surface for another insulator layer, such as a nitride layer 1204. The nitride layer 1204 is formed on the pad oxide layer 1202.

A mask 1206 may be applied on the nitride layer 1204. The mask 1206 having a recess 1208 in a predetermined pattern may be selectively applied to specific section. The recess 1208 is aligned over the buried oxide 1106 without the need for etching the mask 1206. The recess 1208 is not as wide as the buried oxide 1106 and represents the width substantially the same as the width of the isolation structure column 110.

The mask 1206 protects the volume of the substrate 112 that will form the active regions of the first device 104 and the second device 106.

The exclusion of the epitaxial layer 502 of FIG. 5 provides a lower cost process for forming the self-aligned inverted T-shaped isolation structure 102 of FIG. 1. This provides an option where trade-offs may be made between lower cost and higher device density.

Figure 13:
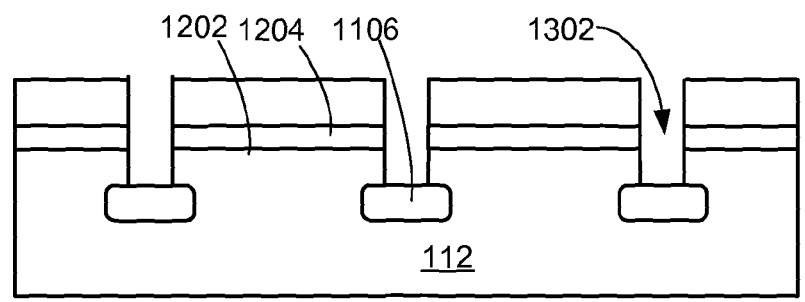
FIG. 13 is a cross-sectional view of the structure of FIG. 12 in an alternate etching phase.

Referring now to FIG. 13, therein is shown a cross-sectional view of the structure of FIG. 12 in an alternate etching phase. An etching process, such as an anisotropic reactive ion etch, removes a portion of the nitride layer 1204, a portion of the pad oxide layer 1202, and a portion of the substrate 112 not covered by the mask 1206 of FIG. 12. The nitride layer 1204, the pad oxide layer 1202, and the substrate 112 are partially removed forming a trench 1302 to the buried oxide 1106. The trench 1302 is perpendicular to the buried oxide 1106. The mask 1206 is removed, such as a stripping process, from the nitride layer 1204.

Figure 14:
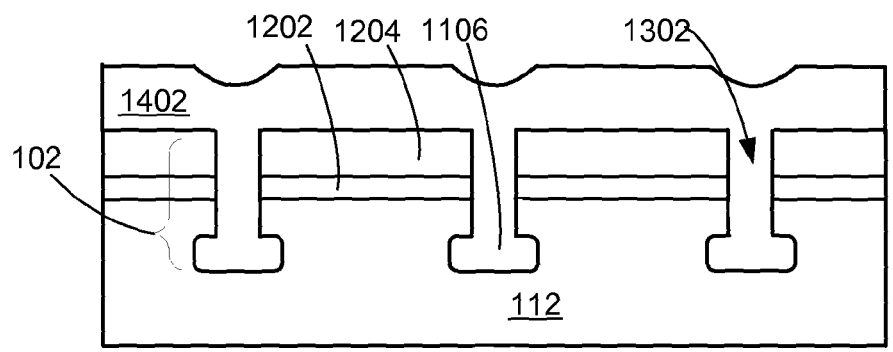
FIG. 14 is a cross-sectional view of the structure of FIG. 13 in an alternate fill phase.

Referring now to FIG. 14, therein is shown a cross-sectional view of the structure of FIG. 13 in an alternate fill phase. The structure of FIG. 14 undergoes a vertical filling process, such as high density plasma (HDP) fill, with a material, such as an oxide, substantially the same as the buried oxide 1106. A gap fill layer 1402 fills the trench 1302 in the substrate 112 forming the self-aligned inverted T-shaped isolation structure 102. The gap fill layer 1402 also covers the nitride layer 1204 over the pad oxide layer 1202. The structure of FIG. 14 with the gap fill layer 1402 may be further processed forming the integrated circuit system 100 of FIG. 1.

Figure 15:
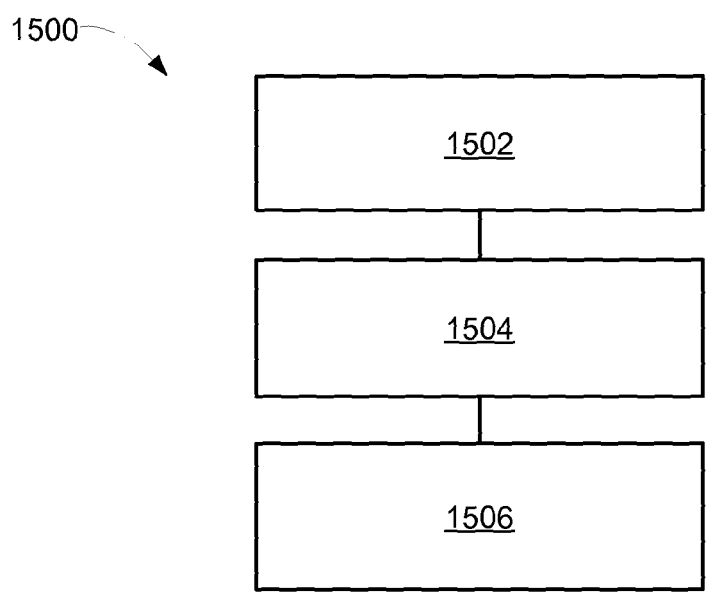
FIG. 15 is a flow chart of an integrated circuit system for manufacture of the integrated circuit system in an embodiment of the present invention.

Referring now to FIG. 15, therein is shown a flow chart of an integrated circuit system 1500 for manufacture of the integrated circuit system 100 in an embodiment of the present invention. The system 1500 includes providing a substrate in a block 1502; forming an isolation structure base in the substrate without removal of the substrate in a block 1504; and forming a first transistor in the substrate next to the isolation structure base in a block 1506.

It has been discovered that the present invention thus has numerous aspects.

It has been discovered that the disclosed structure and the methods improve control, reliability, and yield to form the isolation structure for the carriers that may cause isolation failure.

An aspect is that the present invention is that the buried oxide portion of the isolation structure may be configured using masks and separation by implantation of oxygen. The depth, thickness, length, and width may be controlled while avoiding multiple etch and gap fill steps prone to defects and voids leading to control and reliability issues of isolation structure.

Another aspect of the present invention is that the column portion of the self-aligned inverted T-shaped isolation structure may be formed with a mask directed anisotropic etch to the buried oxide. The etch process is followed by a high density plasma fill. The high density plasma gap fill also allows for void free gap fill for more shallow isolation. This provides a simplified process to form the self-aligned inverted T-shaped isolation structure.

Yet another aspect is that the present invention provides an epitaxial layer of silicon after the low energy implantation of the buried oxide. The epitaxial layer may adjust the depth of the buried oxide as well as repair damage, such as cracks, on the surface of the substrate above the buried oxide. The damage may cause structural and reliability problems if not addressed. The epitaxial layer may also lower defect density versus using silicon over-layer directly in the lower cost process option.

Yet another aspect of the present invention is that self-aligned inverted T-shaped isolation structure is an improvement in the aspect ratio of the shallow trench isolation. The wide trench also provides an overall reduction in the aspect ratio of the trench. The lower aspect ratio improves the gap fill and isolation.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system method and apparatus of the present invention furnish important and heretofore unknown and unavailable solutions, capabilities, and functional aspects for integrated circuit systems. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
    providing a substrate;
    forming an isolation structure base in the substrate through a recess without removal of the substrate;
    forming an epitaxial layer over the isolation structure base after annealing the substrate;
    forming a trench through the epitaxial layer and into the substrate to the isolation structure base filled with isolation material; and
    forming a first transistor in the substrate next to the isolation structure base.

2. The method as claimed in claim 1 further comprising forming a second transistor next to the isolation structure base and at an opposite side of the first transistor.

3. The method as claimed in claim 1 further comprising:
    forming a self-aligned inverted T-shaped isolation structure with a gap fill of the trench.

4. The method as claimed in claim 1 further comprising growing the epitaxial layer over the substrate and the isolation structure base.

5. The method as claimed in claim 1 wherein forming the isolation structure base in the substrate includes annealing the isolation structure base to form a buried oxide.

6. A method of manufacture of an integrated integrated circuit system comprising:
    providing a substrate;
    forming an isolation structure base in the substrate through a recess without removal of the substrate;
    forming an epitaxial layer over the isolation structure base after annealing the substrate;
    forming a trench through the epitaxial layer and into the substrate to the isolation structure base;

forming a self-aligned inverted T-shaped isolation structure with a gap fill of the trench; and forming a first transistor in the substrate next to the self-aligned inverted T-shaped isolation structure.

7. The method as claimed in claim 6 wherein forming the isolation structure base includes forming a buried oxide by implantation of oxygen.

8. The method as claimed in claim 6 wherein forming the trench through the epitaxial layer and into the substrate to the isolation structure base includes etching a self-aligned trench to the isolation structure base with a patterned mask.

9. The method as claimed in claim 6 wherein forming the self-aligned inverted T-shaped isolation structure with the gap fill of the trench includes forming an isolation structure column with a high density plasma oxide fill of the trench.

10. The method as claimed in claim 6 wherein forming the self-aligned inverted T-shaped isolation structure with the gap fill of the trench includes forming an isolation structure column in contact with a buried oxide.

* * * * *